(12) United States Patent
Haruguchi et al.

(10) Patent No.: US 6,683,348 B1
(45) Date of Patent: Jan. 27, 2004

(54) INSULATED GATE BIPOLAR SEMICONDUCTOR DEVICE TRANSISTOR WITH A LADDER SHAPED EMITTER

(75) Inventors: Hideki Haruguchi, Tokyo (JP); Yoshifumi Tomomatsu, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/030,943

(22) PCT Filed: May 22, 2000

(86) PCT No.: PCT/JP00/03238
§ 371 (c)(1),
(2), (4) Date: Apr. 30, 2002

(87) PCT Pub. No.: WO01/91191
PCT Pub. Date: Nov. 29, 2001

(51) Int. Cl.⁷ .............................................. H01L 29/76
(52) U.S. Cl. ................... 257/341; 257/331; 257/139; 257/147
(58) Field of Search ............................. 257/138, 139, 257/147, 341, 342, 344, 345, 331, 401, 496, 618

(56) References Cited

U.S. PATENT DOCUMENTS

| 4,532,534 A | 7/1985 | Ford et al. ................... 257/341 |
| 5,169,793 A | 12/1992 | Okabe et al. ................. 438/138 |
| 5,208,471 A | 5/1993 | Mori et al. ................... 257/327 |
| 6,118,150 A * | 9/2000 | Takahashi .................... 257/341 |
| 6,563,170 B2 * | 5/2003 | Kim ............................ 257/341 |

FOREIGN PATENT DOCUMENTS

| JP | 1-207977 | 8/1989 |
| JP | 11-87702 | 3/1999 |

* cited by examiner

*Primary Examiner*—Minh Loan Tran
*Assistant Examiner*—Thomas L Dickey
(74) *Attorney, Agent, or Firm*—Oblon, Spivak, McClelland, Maier & Neustadt, P.C.

(57) ABSTRACT

A semiconductor device capable of lowering the ON voltage by decreasing the area of the invalid region compared to that of prior art yet maintaining the ability for suppressing the latch-up comparable to that of the conventional IGBTS. The semiconductor device comprises a semiconductor layer of a first conductivity type, a collector layer of a second conductivity type formed on one surface of the semiconductor layer, a base layer of the second conductivity type formed on the other surface of the semiconductor layer, and an emitter layer of the first conductivity type formed in the base layer, wherein the emitter layer having the shape of a ladder being constituted by two crossbeams and cleats formed between the crossbeams, the cleat being provided even between facing end portions of the two crossbeams.

16 Claims, 4 Drawing Sheets

US 6,683,348 B1

INSULATED GATE BIPOLAR SEMICONDUCTOR DEVICE TRANSISTOR WITH A LADDER SHAPED EMITTER

TECHNICAL FIELD

This invention relates to a semiconductor device having an insulated gate. More particularly, the invention relates to a gate-insulated bipolar transistor that is favorably used as a power switching element.

BACKGROUND OF THE INVENTION

As a power switching element, in recent years, there has been widely used an element called Insulated Gate Bipolar Transistor (hereinafter referred to as IGBT). FIGS. 10 to 13 are diagrams illustrating the basic constitution of a conventional IGBT, wherein FIG. 10 is a plan view of the main surface of a semiconductor substrate illustrating the constitution of the conventional IGBT, FIG. 11 is a sectional view of the IGBT along a line XI—XI of FIG. 10, FIG. 12 is a sectional view of the IGBT along a line XII—XII of FIG. 10, and FIG. 13 is a sectional view of the IGBT along a line XIII—XIII of FIG. 10.

In FIGS. 10 to 13, reference numeral 50 denotes an n-layer serving as a semiconductor substrate of a first conductivity type, 51 denotes a p-collector layer serving as a collector region of a second conductivity type, 52 denotes a collector electrode which is in contact with the p-collector layer 51, reference numeral 53 denotes a p-base layer selectively formed in the main surface of the semiconductor substrate 50 and serving as a first base region of the second conductivity type, and 54 denotes an $n^+$-emitter layer of the first conductivity type selectively formed in the p-base region 53. Reference numeral 55 denotes a gate electrode, and 56 denotes a gate oxide film serving as a gate insulating film. A belt-like gate electrode 55 is formed on the surface of the p-base layer 53 sandwiched between the $n^-$-layer 50 and the $n^+$-layer 54, and on the surface of the $n^-$-layer 50 via the gate oxide film 56. Reference numeral 57 denotes a belt-like emitter electrode which is formed so as to be in contact with both a cleat 58a of the ladder-like $n^+$-layer 54 and the p-base layer 53 exposed in the opening portion 59 of the ladder, and so as to cover them. Reference numeral 60 denotes a channel region formed near the surface of the p-base layer 53 sandwiched between the $n^-$-layer 50 and the $n^+$-layer 54.

When observed from the surface as described above, the $n^+$-emitter layer 54 is formed like a ladder, and a portion that comes in contact with both the emitter of the emitter electrode 57 and the p-base layer 53, is arranged perpendicularly to the cleat 58a of ladder and in parallel with a crossbeam 58b of ladder. At the end portion of a cell of a striped shape, a contact region 61 of the emitter electrode is protruding longer than the crossbeam 58b of ladder of the source.

Operation of the IGBT shown in FIGS. 10 to 13 will now be described below. If the emitter electrode 57 is grounded, and a positive voltage is applied to the gate electrode 55 and to the collector electrode 52, then, the electric potential of the surface of the p-base layer 53 just under the gate insulating film 56 is inverted to form an n-type channel. Electrons flow into the channel region 60 to turn the IGBT on.

In this case, the resistance decreases in the region of the $n^-$-layer 50 with the result that the electric conductivity of the $n^-$-layer 50 is modulated by the injection of holes into the $n^-$-layer 50 from the p-collector layer 51 on the side of the collector electrode 52. Due to the modulation in the electric conductivity, the IGBT exhibits a low on-resistance in its ON state accompanied. On the contrary, the IGBT has a fault that it easily latches up due to its parasitic thyristor structure.

When the IGBT is in the ON state, holes are injected into the $n^-$-layer 50 from the p-collector layer 51 on the side of the collector electrode 52 as described above. The holes partly extinguish upon being recombined with electrons injected into the $n^-$-layer 50 from the $n^+$-emitter layer 54 through the channel, and partly escape into the emitter electrode 57 passing through a pinch resistor portion in the p base layer 53. Generally, the holes are not injected into the $n^+$-emitter layer 54 due to a built-in voltage across the p-base layer 53 and the $n^+$-emitter layer 54. Accordingly, the parasitic thyristor is not turned on, and the IGBT is not latched up.

If a pinch resistance of a portion of the p-base layer 53 where the hole current flows through is denoted by Rb and the hole current by Jh, then, a voltage expressed by the product of Rb and Jh is produced across the p base layer 53 and the $n^+$-emitter layer 54. If this voltage becomes larger than the above built-in voltage, the holes are injected from the p-base layer 53 to the $n^+$-emitter layer 54 and, hence, electrons are injected from the $n^+$-emitter layer 54 to the p-base layer 53. That is, a parasitic npnp thyristor formed by $n^+$-emitter layer 54, p-base layer 53, $n^-$-layer 50 and collector layer 52, is latched up making it difficult to control the current, and resulting in a breakage. The breakage can be effectively prevented by lowering the pinch resistance Rb or the hole current Jh.

The IGBT chip has a structure in which the basic cells of the structure shown in FIGS. 10 to 13 are arranged like a stripe. In a portion where the electric current concentrates in the chip, a contrivance has been made so that the latch-up will not easily take place. For example, the end portion of the cell is one of the portions where the electric current tends to concentrate. The emitter of this portion has a shape as shown in FIG. 10 in which the contact region 61 of the emitter electrode protrudes longer than the crossbeam 58b of ladder of the source. Owing to this structure, no electron is supplied at the end portion of the cell. Therefore, only a small hole current Jh is injected from the p-collector region 51 and the parasitic thyristor is not easily turned on.

In the conventional IGBT which is a semiconductor device having a structure which is not easily latched up, the contact region of the emitter electrode 61 is protruded longer than the crossbeam 58b of ladder of the source at the end portion of the cell. This structure help to improve endurance against the breakage, but at the same time it causes the following problems.

That is, since there is formed no emitter region at the end portion of the cell, the channel length becomes short per a unit area, and invalid region increases. This results in an increase in the current density and, hence, in an increase in the ON voltage, which is a problem.

This invention was accomplished in order to solve the above problems, and has an object of providing a semiconductor device capable of lowering the ON voltage by decreasing the area of the invalid region compared to that of prior art yet maintaining the ability for suppressing the latch-up to a degree comparable to that of the conventional IGBTs.

DISCLOSURE OF THE INVENTION

This invention is concerned with a semiconductor device comprising a semiconductor layer of a first conductivity type, a collector layer of a second conductivity type formed on one surface of the semiconductor layer, a base layer of the second conductivity type formed on the other surface of the semiconductor layer, and an emitter layer of the first conductivity type formed in the base layer, wherein the emitter layer having a shape of a ladder being constituted by two crossbeams and cleats formed between the crossbeams, and the cleat being provided even between facing end portions of the two crossbeams.

This makes it possible to obtain a semiconductor structure in which the area of the invalid region is minimized.

There are further provided an emitter electrode formed on the semiconductor layer and having a contact part that comes in contact with the base layer and the emitter layer, and gate electrodes formed on both sides of the contact part on the semiconductor layer, wherein an end portion of the contact part is in contact with a first exposed portion of the base layer that is surrounded by the emitter layer.

This makes it possible to obtain a structure in which the area of the invalid region is minimized.

Further, the emitter electrode, the gate electrodes and the collector electrode are maintained at predetermined potentials, respectively, thereby to form a channel region in the base layer just under the gate electrodes formed on both sides at the end portion of the contact part. This makes it possible to obtain a structure in which the area of the invalid region is minimized.

The end portion of the contact part is in contact with the cleat formed at the facing end portions of the two crossbeams. This makes it possible to obtain a structure in which the area of the invalid region is minimized.

There is further provided a second exposed portion of the base layer constituted by being surrounded by the crossbeams and the cleats, wherein a length of the first exposed portion along the crossbeams being larger than a length of the second exposed portion along the crossbeams. This makes it possible to prevent the semiconductor device from being latched up.

An impurity concentration of the emitter layer surrounding the first exposed portion is smaller than an impurity concentration of other portions of the emitter layer. Therefore, the emitter ballast resistance increases and the electronic current supplied in a state where the semiconductor device is turned on becomes smaller than that of other regions, making it possible to obtain a structure which prevents the latch-up.

A width of the crossbeams surrounding the first exposed portion is narrower than a width of the crossbeams surrounding the second exposed portion. This makes it possible to increase the emitter ballast resistance and to suppress the electronic current. It is therefore allowed to relax the concentration of the hole current Jh and, hence, to obtain a semiconductor structure which prevents the latch-up.

A width of the cleats surrounding the first exposed portion is narrower than a width of other cleats of the emitter layer. This makes it possible to increase the emitter ballast resistance and to suppress the electronic current. It is therefore allowed to relax the concentration of the hole current Jh and, hence, to obtain a semiconductor structure which prevents the latch-up.

An impurity concentration of the first exposed portion of the base layer is larger than an impurity concentration of the second exposed portion of the base layer. Accordingly, the channel portion is less likely to be formed in the base region where the impurity concentration is larger than in other portions where the impurity concentration is not high, suppressing the flow of electronic current, relaxing the concentration of the hole current Jh and making it possible to obtain a structure capable of preventing the latch-up.

Further, a gate-insulating film is formed on the semiconductor layer to cover the gate electrodes, and a thickness of the gate-insulating film on the base layer between the crossbeams surrounding the first exposed portion and the semiconductor layer, is larger than a thickness of the gate insulating film on the base layer between the crossbeams surrounding the second exposed portion and the semiconductor layer. This increases the threshold voltage at the end portion of the contact part making it possible to obtain a structure that prevents the latch-up.

DETAILED DESCRIPTION OF THE PREFERRED EMBODIMENT

The invention will now be described in further detail with reference to the accompanying drawings.

Embodiment 1

Figure 2:
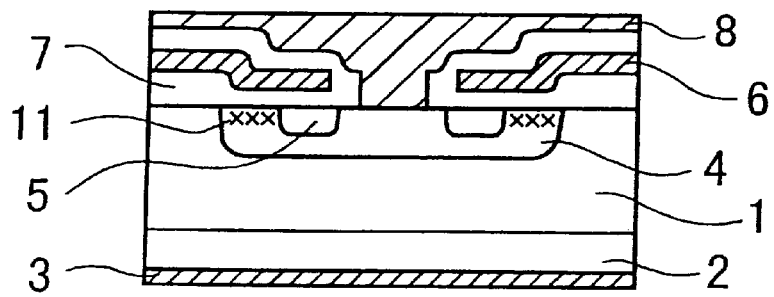
FIG. 2 is a sectional view of an IGBT along a line II—II of FIG. 1.
Figure 3:
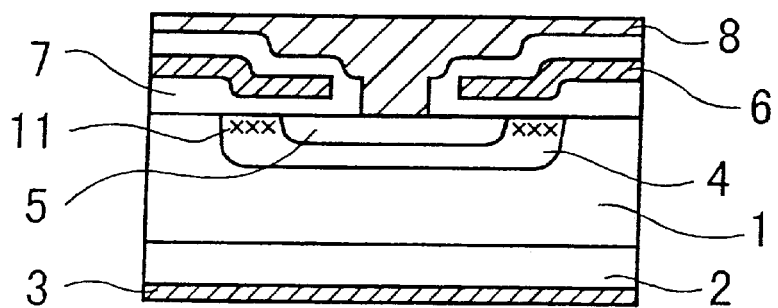
FIG. 3 is a sectional view of the IGBT along a line III—III of FIG. 1.

An embodiment 1 of this invention will now be described with reference to FIGS. 1 to 3.

Figure 1:
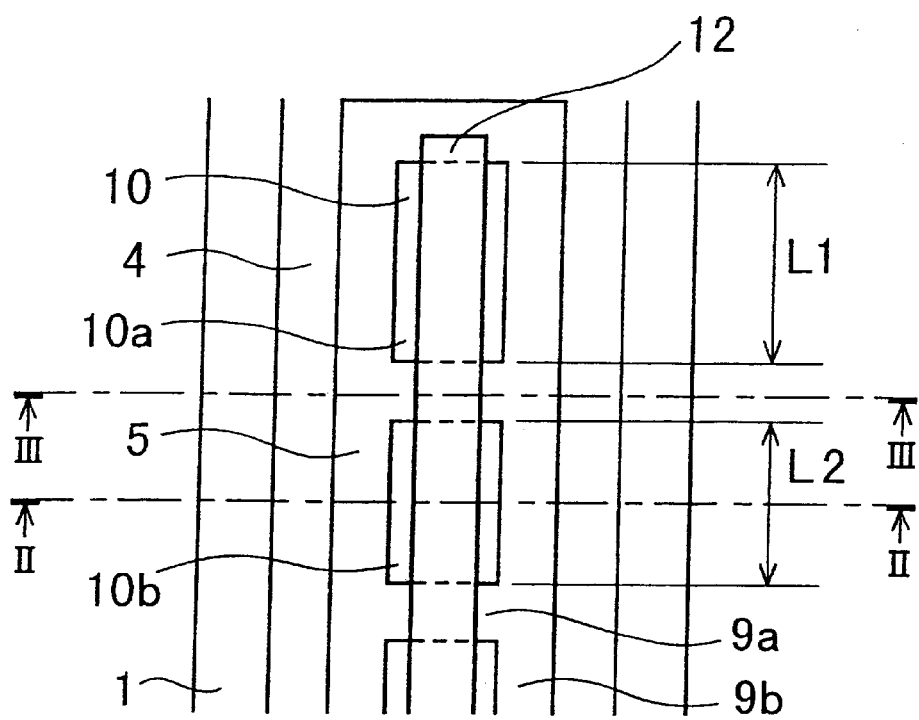
FIG. 1 is a view illustrating the constitution of a semiconductor device on the main surface of a semiconductor substrate according to an embodiment 1 and an embodiment 2 of this invention.

FIG. 1 is a view illustrating the constitution of a semiconductor device on the main surface of a semiconductor substrate according to the embodiment 1 of the invention. This embodiment deals with the constitution of an IGBT that is a semiconductor device. FIG. 2 is a sectional view of the IGBT along a line II—II of FIG. 1, and FIG. 3 is a sectional view of the IGBT along a line III—III of FIG. 1. In these drawings, reference numeral 1 denotes an n⁻-layer as a semiconductor substrate, 2 denotes a p-collector layer as a collector region, 3 denotes a collector electrode that comes into contact with the p-collector layer 2, reference numeral 4 denotes a p-base layer as a base region which is selectively formed in the main surface of the n⁻-layer 1, and reference numeral 5 denotes an n⁺-emitter layer selectively formed in the p-base layer 4. Reference numeral 6 denotes a gate electrode, 7 denotes a gate oxide film as a gate-insulating film, and 8 denotes an emitter electrode. The n⁺-emitter layer 5 is constituted by two crossbeams 9b and cleats 9a formed therebetween in the shape of a ladder. The cleat 9a is formed even between the facing end portions of the two crossbeams 9b unlike that of the prior art. Reference numeral 10 denotes an exposed portion of the p-base layer 4 surrounded by the n⁺-emitter layer 5, which includes an exposed portion 10a of the p-base layer 4 surrounded by the end portion of the n⁺-emitter layer 5 that comes in contact with an end portion of a contact region 12 that will be described later, and an exposed portion 10b of the p-base layer 4 surrounded by the n⁺-emitter layer 5 other than the end portion of the n⁺-emitter layer 5. In the embodiment 1, a length L1 of the exposed portion 10a in a direction in parallel with the crossbeams 9b is equal to a length L2 of the exposed portion 10b in a direction in parallel with the crossbeams 9b. Reference numeral 11 denotes a channel region formed in the surface of the p-base layer, and 12 denotes a contact region of the emitter electrode 8 that comes in contact with the silicon surface of the p-base layer 4 or the n⁺-emitter layer 5. The emitter electrode 8 is covering the whole surface of the IGBT. Though not diagramed, the lower side of the contact region 12 has an end portion that is surrounded by the n⁺-emitter layer 5 like that of the upper side.

Next, described below is the operation of the IGBT shown in FIGS. 1 to 3. In this embodiment 1, too, like in the conventional IGBT, when the emitter electrode 8 is grounded and a positive voltage is applied to the gate electrodes 6 and to the collector electrode 3, the electric potential of near the surface of the p-base layer 4 just under the gate-insulating film 7 is inverted to form an n-type channel 11. Electrons flow through the channel region 11 to turn the IGBT on. The IGBT chip has a constitution in which the basic cells shown in FIG. 1 are arranged like a stripe. Here, however, though the p-collector layer 2 is formed on the whole back surface of the chip, the basic cells are not evenly arranged on the whole surface of the chip. In general, a guard ring is formed along the outer circumference, and the basic cells are not formed.

When the IGBT is turned on, the holes injected into the n⁻-layer 1 from the p-collector layer 2, pass through from the contact region 12 to the emitter electrode 8. Here, however, the hole current from the outer periphery of the chip tends to concentrate in the contact region 12 at the end portion of the cell; i.e., a parasitic thyristor tends to be turned on and the latch-up breakage easily occurs.

To prevent the latch-up, it is generally using a manner to shorten the length of the n⁺-emitter region relative to the length of the contact region, form no MOS at the end portion of the cell, and secure a passage only for the hole current to flow through thereby to prevent the occurrence of latch-up.

As described above, however, this results in a decrease in the region for forming the channel and, hence, an increase in the ON voltage. The ON voltage stands for a voltage across the collector and the emitter of when a voltage is applied to the gate of the IGBT (to turn the IGBT on) to flow a rated current across the collector and the emitter.

In this embodiment 1, the end portion of the contact region 12 is surrounded by the n⁺-emitter layer 5 if observed from the upper side as shown in FIG. 1. Due to this constitution, the region where the channel is formed becomes larger than that of the prior art and the area where the channel is formed increases, making it possible to decrease the current density and, hence, to decrease the ON voltage compared to the prior art.

Further, since the end portion of the contact region 12 is overlapped on the n⁺-emitter layer 5, the ON voltage can be further lowered.

The action and effect same as those described above can be exhibited even by a constitution in which the end portion of the contact region 12 is surrounded by the n⁺-emitter layer 5 instead of being overlapped on the n⁺-emitter layer 5.

Embodiment 2

An embodiment 2 is so constituted as to establish a relationship L1>L2 between the length L1 of the exposed portion 10a of the p-base layer 4 in a direction in parallel with the crossbeams 9b and the length L2 of the exposed portion 10b of the p-base layer 4 in a direction in parallel with the crossbeams 9b. While the IGBT is being turned on, the electronic current is injected into the n⁻-layer 1 from the emitter electrode 8 through the n⁺-emitter layer 5 and the channel forming region 11. When observed from the surface, the n⁺-emitter layer 5 is contacted to the emitter electrode 8 only at the cleats 9a of the n⁺-emitter layer 5 which is in the shape of a ladder. Therefore, the emitter ballast resistance is the smallest at the cleats 9a and increases as it goes away from the cleats 9a.

Namely, the amount of supplying electrons decreases as the distance increases from the cleats 9a. With the IGBT being turned on, the holes supplied from the p-collector layer 2 tend to be collected at a portion where there exist many electrons. Therefore, the hole density Jh decreases in the portions of the n⁺-emitter layer 5 away from the cleats preventing the occurrence of latch-up.

In the embodiment 2, the lengths of the crossbeams of the n⁺-emitter layer 5 are selected to be L1>L2, whereby an MOS is formed even at the end portion of the contact region 12 of the emitter electrode 8, making it possible to obtain a structure that prevents the latch-up while maintaining the area of a portion where the channel is formed. Upon setting the relationship L1>L2 in addition to lowering the ON voltage like in the embodiment 1, the IGBT chip becomes less subject to be broken than that of the embodiment 1.

Embodiment 3

Figure 4:
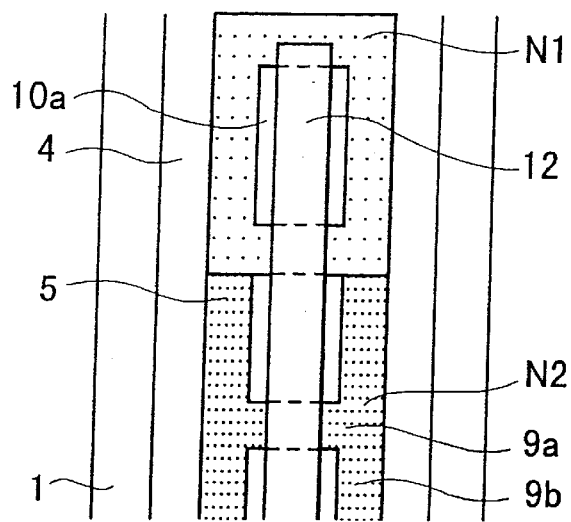
FIG. 4 is a view illustrating the constitution on the main surface of the semiconductor substrate of the semiconductor device according to an embodiment 3 of the invention.

FIG. 4 is a diagram illustrating the constitution of the semiconductor device on the main surface of the semiconductor substrate according to an embodiment 3 of this invention. In FIG. 4, reference numerals the same as those of FIGS. 1 to 3 denote the same or corresponding portions and their description is not repeated. As shown in FIG. 4, the impurity concentration N1 of the n⁺-emitter layer 5 surrounding the end portion of the contact region 12 of the emitter electrode 8 is selected to be smaller than the impurity concentration N2 of other portions of the n⁺-emitter layer 5. The n⁺-emitter layer 5 having the impurity concentration N1 is represented by sparse dots, and the n⁺-emitter layer 5 of other areas having the impurity concentration N2 is represented by dense dots. Different impurity concentrations in the n⁺-emitter layer 5 are accomplished by changing the mask and by changing the number of times of injecting ions in the steps of fabrication.

Concerning the impurity concentration in the n⁺-emitter layer 5 in the embodiment 3, the impurity concentration in the n⁺-emitter layer 5 surrounding the end portion of the contact region 12 of the emitter electrode 8 is selected to be smaller than that of other portions, whereby the emitter ballast resistance increases, and the electronic current that is supplied in a state where the IGBT is turned on becomes smaller than that of other regions, making it possible to obtain a structure that prevents the latch-up.

Embodiment 4

Figure 5:
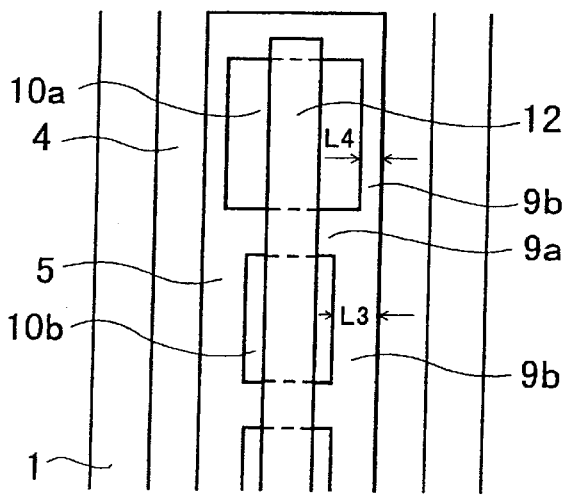
FIG. 5 is a view illustrating the constitution on the main surface of the semiconductor substrate of the semiconductor device according to an embodiment 4 of the invention.

FIG. 5 is a diagram illustrating the constitution of the semiconductor device on the main surface of the semiconductor substrate according to an embodiment 4 of this invention. In FIG. 5, reference numerals the same as those of FIGS. 1 to 3 denote the same or corresponding portions and their description is not repeated. As shown in FIG. 5, the width L4 of the crossbeams 9b in the n⁺-emitter layer 5 of a portion surrounding the end of the contact region 12 of the emitter electrode 8, is selected to be narrower than the width L3 of the crossbeams 9b of other portions of the n⁺-emitter layer 5 (L3>L4). The width of the n⁺-emitter layer 5 is differed by changing the mask in the step of fabrication.

In the embodiment 4, the width L4 of the crossbeams 9b in the n⁺-emitter layer 5 of the portion surrounding the end portion of the contact region 12 of the emitter electrode 8 is selected to be narrower than the width L3 of the crossbeams 9b of the n⁺-emitter layer 5 of other portions, whereby the emitter ballast resistance increases and the electronic current is suppressed. Therefore, the concentration of the hole current Jh is relaxed, and can be obtained a structure preventing the latch-up.

Embodiment 5

Figure 6:
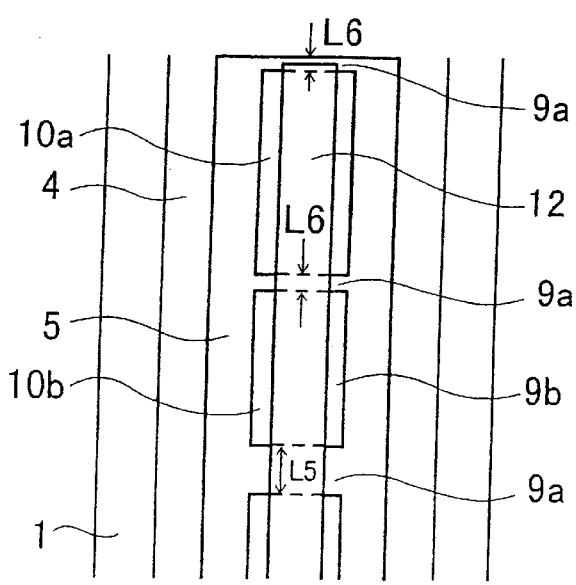
FIG. 6 is a view illustrating the constitution on the main surface of the semiconductor substrate of the semiconductor device according to an embodiment 5 of the invention.

FIG. 6 is a diagram illustrating the constitution of the semiconductor device on the main surface of the semiconductor substrate according to an embodiment 5 of this invention. In FIG. 6, reference numerals the same as those of FIGS. 1 to 3 denote the same or corresponding portions and their description is not repeated. As shown in FIG. 6, the width L6 of the cleats 9a in the n⁺-emitter layer 5 of a portion surrounding the end portion of the contact region 12 of the emitter electrode 8, is selected to be narrower than the width L5 of the cleats 9b of other portions of the n⁺-emitter layer 5 (L5>L6).

In the embodiment 5, the width L6 of the cleats 9a in the n⁺-emitter layer 5 of the portion surrounding the end portion of the contact region 12 of the emitter electrode 8 is selected to be narrower than the width L5 of the cleats 9a of the n⁺-emitter layer 5 of other portions, whereby the emitter ballast resistance increases and the electronic current is suppressed. Therefore, the concentration of the hole current Jh is relaxed, and there is obtained a structure preventing the latch-up.

Embodiment 6

Concerning the structure described in the embodiment 1, the impurity concentration of the p-base region 4 surrounded by the n⁺-emitter layer 5 of a portion surrounding the end portion of the contact region 12 of the emitter electrode 8 is selected to be larger than the concentration of the p-base region 4 of other portions.

The threshold voltage (the gate voltage necessary for forming an n-type channel for flowing the electric current) of a portion of the p-base region 4 where the impurity concentration is large, is higher than that of the portions where the impurity concentration is small. That is, even when the same gate voltage is applied, the portion of the p-base region 4 where the impurity concentration is large permits the channel to be formed less than other portions, and the electronic current flows less. Therefore, the concentration of the hole current Jh is relaxed, and there is obtained a structure preventing the latch-up.

Embodiment 7

Figure 7:
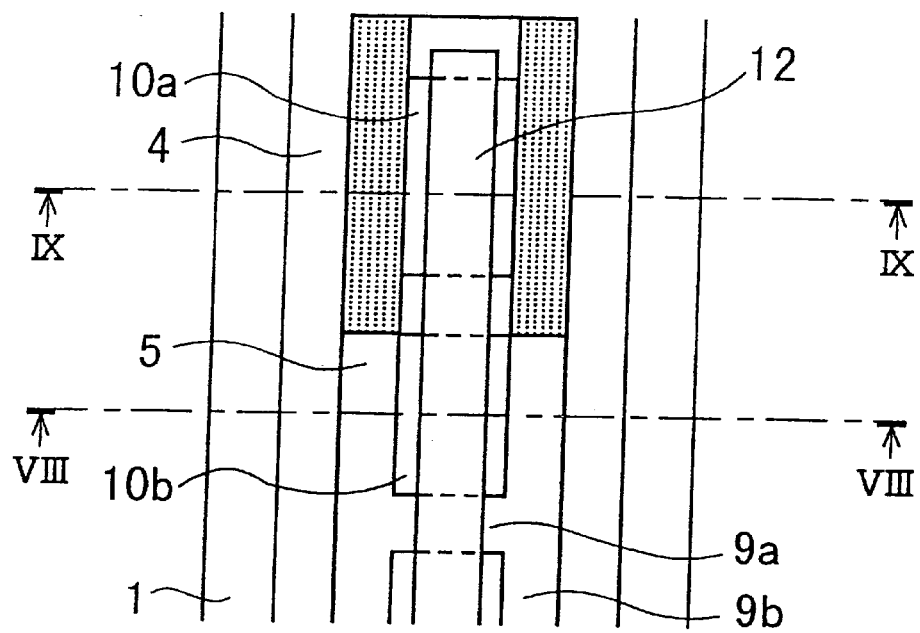
FIG. 7 is a view illustrating the constitution on the main surface of the semiconductor substrate of the semiconductor device according to an embodiment 7 of the invention.
Figure 8:
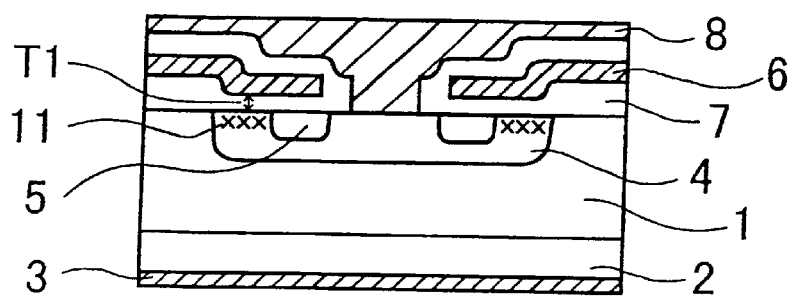
FIG. 8 is a sectional view of the semiconductor device along a line VIII—VIII of FIG. 7.
Figure 9:
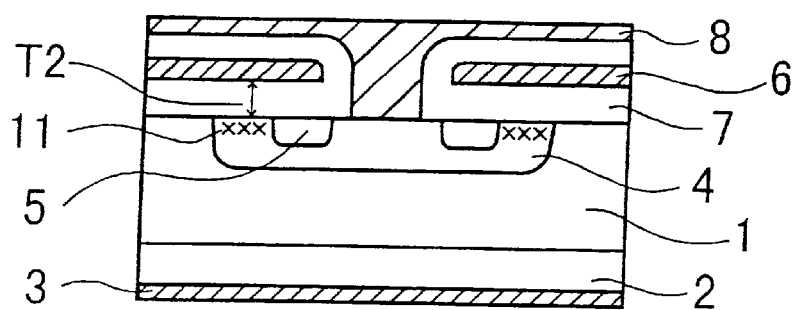
FIG. 9 is a sectional view of the semiconductor device along a line IX—IX of FIG. 7.
Figure 10:
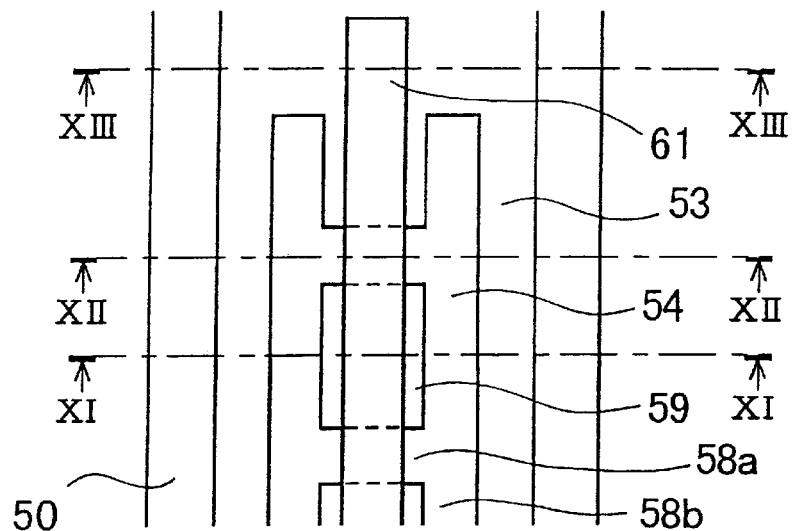
FIG. 10 is a plan view illustrating the constitution on the main surface of a semiconductor substrate of a conventional IGBT.
Figure 11:
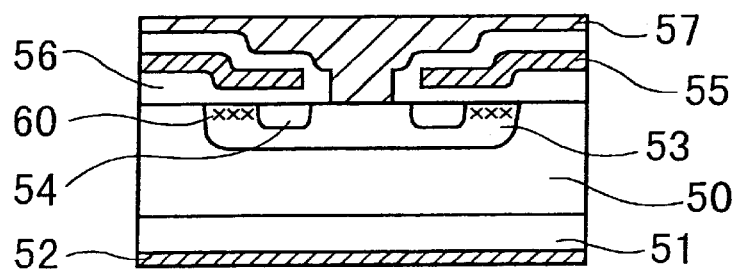
FIG. 11 is a sectional view of the IGBT along a line XI—XI of FIG. 10.
Figure 12:
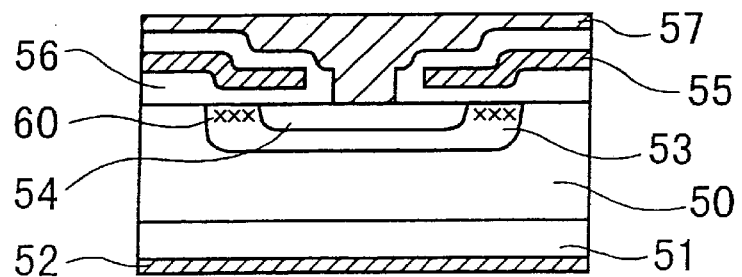
FIG. 12 is a sectional view of the IGBT along a line XII—XII of FIG. 10.
Figure 13:
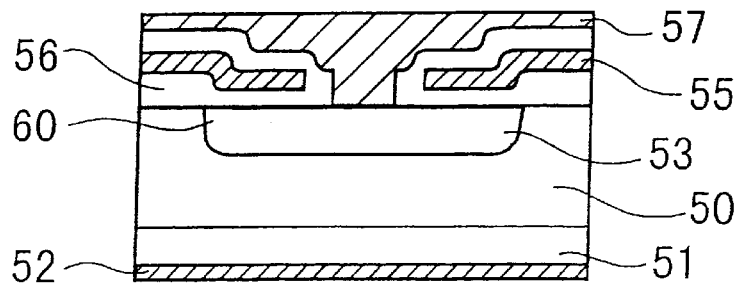
FIG. 13 is a sectional view of the IGBT along a line XIII—XIII of FIG. 10.

FIG. 7 is a view illustrating the constitution of the semiconductor device on the main surface of the semiconductor substrate according to an embodiment 7 of the invention, FIG. 8 is a sectional view of the IGBT along a line VIII—VIII of FIG. 7, and FIG. 9 is a sectional view of the IGBT along a line IX—IX of FIG. 7. In FIGS. 7 to 9, reference numerals the same as those of FIGS. 1 to 3 denote the same or corresponding portions, and their description is not repeated. Referring to FIG. 7, the thickness (thickness Ti indicated by an arrow in FIG. 8) of the gate-insulating film 7 formed on the surface of the p-base region 4 is smaller than the thickness (thickness T2 indicated by an arrow in FIG. 9) of the gate-insulating film 7 formed on the surface of the p-base region 4 of a portion (sparsely dotted portion) arranged in parallel with the contact region 12 of the emitter electrode 8 of a portion of the n⁺-emitter layer 5 surrounding the end portion of the contact region 12 of the emitter electrode 8 and of a portion sandwiched between the n⁺-emitter layer 5 indicated by the sparsely dotted portion and the n⁻-layer 1. The threshold voltage of a portion where the gate insulating film 7 is thickly formed becomes higher than that of the portions where the gate insulating film 7 is thinly formed. Upon increasing the threshold voltage at the end portion of the contact region 12 of the emitter electrode 8, it is allowed to obtain a structure preventing the latch-up like the structure of the embodiment 6.

As described above, this embodiment makes it possible to obtain a structure preventing the occurrence of latch-up breakage while minimizing the area of the invalid region of the semiconductor device.

As described above, the semiconductor device of this invention is suited for preventing the latch-up breakage while minimizing the area of the invalid region thereof. Accordingly, the semiconductor device of the invention is suited as a gate bipolar transistor that can be favorably used as a power switching element.

What is claimed is:

1. A semiconductor device comprising:

a semiconductor layer of a first conductivity type;

a collector layer of a second conductivity type formed on one surface of said semiconductor layer;

a base layer of said second conductivity type formed on the other surface of said semiconductor layer;

an emitter layer of said first conductivity type formed in said base layer, said emitter layer having a shape of a ladder including two crossbeams, interior cleats formed between said crossbeams, and exterior cleats being provided between facing end portions of said two crossbeams; and an emitter electrode formed on said semiconductor layer and having a contact part that comes in contact with said base layer and said emitter layer, said contact part having an end portion overlapping and terminating on said exterior cleats of the emitter layer.

2. The semiconductor device of claim 1, further comprising:
   gate electrodes formed on both sides of said contact part on said semiconductor layer;
   wherein said end portion of said contact part is in contact with a first exposed portion of said base layer that is surrounded by said emitter layer.
3. The semiconductor device of claim 2,
   wherein said emitter electrode, said gate electrodes and said collector electrode are maintained at predetermined potentials, respectively, thereby to form a channel region in said base layer just under said gate electrodes formed on both sides at the end portion of said contact part.
4. The semiconductor device of claims 2, further comprising:
   a second exposed portion of said base layer being surrounded by said crossbeams and said interior cleats,
   wherein a length of said first exposed portion along said crossbeams being larger than a length of said second exposed portion along said crossbeams.
5. The semiconductor device of claims 3, further comprising:
   a second exposed portion of said base layer being surrounded by said crossbeams and said interior cleats,
   wherein a length of said first exposed portion along said crossbeams being larger than a length of said second exposed portion along said crossbeams.
6. The semiconductor device of claim 2,
   wherein an impurity concentration of said emitter layer surrounding said first exposed portion is smaller than an impurity concentration of other portions of said emitter layer.
7. The semiconductor device of claim 3,
   wherein an impurity concentration of said emitter layer surrounding said first exposed portion is smaller than an impurity concentration of other portions of said emitter layer.
8. The semiconductor device of claim 2,
   wherein a width of said crossbeams surrounding said first exposed portion of said base layer is narrower than a width of said crossbeams surrounding a second exposed portion of said base layer.
9. The semiconductor device of claim 3,
   wherein a width of said crossbeams surrounding said first exposed portion of said base layer is narrower than a width of said crossbeams surrounding a second exposed portion of said base layer.
10. The semiconductor device of claim 2,
    wherein a width of cleats surrounding said first exposed portion is narrower than a width of other cleats of said emitter layer.
11. The semiconductor device of claim 3,
    wherein a width of cleats surrounding said first exposed portion is narrower than a width of other cleats of said emitter layer.
12. The semiconductor device of claim 2,
    wherein an impurity concentration of said first exposed portion of said base layer is larger than an impurity concentration of a second exposed portion of said base layer.
13. The semiconductor device of claim 3,
    wherein an impurity concentration of said first exposed portion of said base layer is larger than an impurity concentration of a second exposed portion of said base layer.
14. The semiconductor device of claim 2,
    wherein a gate-insulating film is formed on said semiconductor layer to cover said gate electrodes, and
    a thickness of said gate-insulating film on said base layer between said crossbeams surrounding said first exposed portion and said semiconductor layer, is larger than a thickness of said gate insulating film on said base layer between said crossbeams surrounding a second exposed portion of said base layer and said semiconductor layer.
15. The semiconductor device of claim 3,
    wherein a gate-insulating film is formed on said semiconductor layer to cover said gate electrodes, and
    a thickness of said gate-insulating film on said base layer between said crossbeams surrounding said first exposed portion and said semiconductor layer, is larger than a thickness of said gate insulating film on said base layer between said crossbeams surrounding a second exposed portion of said base layer and said semiconductor layer.
16. The semiconductor device of claim 1, further comprising:
    a second exposed portion of said base layer being surrounded by said crossbeams and said interior cleats,
    wherein a length of said first exposed portion along said crossbeams is larger than a length of said second exposed portion along said crossbeams.

* * * * *